(12) United States Patent
Teitel et al.

(10) Patent No.: US 10,193,574 B1
(45) Date of Patent: Jan. 29, 2019

(54) EFFICIENT SYNDROME CALCULATION IN PROCESSING A GLDPC CODE

(71) Applicant: APPLE INC., Cupertino, CA (US)

(72) Inventors: Moti Teitel, Tel Aviv (IL); Asaf Landau, Modiin (IL); Tomer Ish-Shalom, Raanana (IL)

(73) Assignee: APPLE INC., Cupertino, CA (US)

( * ) Notice: Subject to any disclaimer, the term of this patent is extended or adjusted under 35 U.S.C. 154(b) by 324 days.

(21) Appl. No.: 15/158,620

(22) Filed: May 19, 2016

(51) Int. Cl.
| | |
|---|---|
| *H03M 13/00* | (2006.01) |
| *H03M 13/15* | (2006.01) |
| *H03M 13/11* | (2006.01) |
| *H04L 1/00* | (2006.01) |
| *H03M 13/29* | (2006.01) |
| *G11B 20/18* | (2006.01) |
| *G06F 11/10* | (2006.01) |

(52) U.S. Cl.
CPC ..... *H03M 13/159* (2013.01); *H03M 13/1102* (2013.01); *H03M 13/1111* (2013.01); *H03M 13/1148* (2013.01); *H04L 1/0045* (2013.01); *G06F 11/10* (2013.01); *G11B 2020/185* (2013.01); *H03M 13/2921* (2013.01)

(58) Field of Classification Search
CPC ............... H03M 13/15; H03M 13/151; H03M 13/1148; H03M 13/159; H03M 13/1102; H03M 13/1185; H03M 13/2921; H04L 1/0045; H04L 1/0057; G11B 2020/1833; G11B 2020/185; G06F 11/10
USPC .......................................... 714/785, 800–805
See application file for complete search history.

(56) References Cited

U.S. PATENT DOCUMENTS

| | | | |
|---|---|---|---|
| 4,030,067 A | 6/1977 | Howell et al. | |
| 6,912,685 B2 | 6/2005 | Takeda et al. | |
| 8,176,381 B2 | 5/2012 | Djordjevic et al. | |
| 8,381,082 B1 | 2/2013 | Tang et al. | |
| 8,386,879 B2 | 2/2013 | Djordjevic et al. | |
| 8,677,227 B2 | 3/2014 | Gross et al. | |
| 9,236,890 B1 * | 1/2016 | Anholt | H03M 13/2906 |
| 2008/0052593 A1 * | 2/2008 | Lee | H03M 13/1105 714/758 |

(Continued)

FOREIGN PATENT DOCUMENTS

EP          2348641 A1      7/2011

*Primary Examiner* — Albert Decady
*Assistant Examiner* — Osman M Alshack
(74) *Attorney, Agent, or Firm* — D. Kligler IP Services Ltd.

(57) ABSTRACT

An apparatus includes an interface, main and secondary processing modules, and circuitry. The interface is configured to receive input data to be processed in accordance with a GLDPC code defined by a parity-check-matrix including multiple sub-matrices, each sub-matrix including a main diagonal and one or more secondary diagonals, and each of the main and secondary diagonals includes N respective block matrices. The main processing module is configured to calculate N first partial syndromes based on the input data and on the block matrices of the main diagonals. The secondary processing module is configured to calculate N second partial syndromes based on the input data and on the block matrices of the secondary diagonals. The circuitry is configured to produce N syndromes by respectively combining the N first partial syndromes with the N second partial syndromes, and to encode or decode the input data, based on the N syndromes.

20 Claims, 5 Drawing Sheets

(56) References Cited

U.S. PATENT DOCUMENTS

| | | | |
|---|---|---|---|
| 2009/0199065 A1* | 8/2009 | Djordjevic | H03M 13/1174 714/752 |
| 2013/0031447 A1* | 1/2013 | Sharon | H03M 13/1128 714/785 |
| 2013/0170272 A1* | 7/2013 | Anholt | G11C 11/5642 365/45 |
| 2013/0258738 A1* | 10/2013 | Barkon | G11C 11/5642 365/45 |
| 2014/0059403 A1* | 2/2014 | Sommer | G06F 11/1012 714/758 |
| 2014/0325268 A1* | 10/2014 | Moroz | G06F 11/1012 714/15 |
| 2015/0106680 A1 | 4/2015 | Djordjevic et al. | |
| 2017/0250713 A1* | 8/2017 | Langhammer | H03M 13/1515 |

* cited by examiner

US 10,193,574 B1

EFFICIENT SYNDROME CALCULATION IN PROCESSING A GLDPC CODE

TECHNICAL FIELD

Embodiments described herein relate generally to Error Correction Coding (ECC), and particularly to methods and systems for efficient syndrome calculation in processing GLDPC codes.

BACKGROUND

In various fields, such as data communications and data storage, the data is protected by applying Error Correction Coding (ECC). ECC typically involves calculating redundancy or parity bits that can be used for detecting and correcting corrupted data. Some types of error correction codes, such as Generalized Low-Density Parity-Check (GLDPC) codes, can be defined using a parity-check matrix. Processing GLDPC codes typically involves calculating a syndrome for each of the component codes. The syndromes are then used for finding error locations in decoding, and for generating redundancy information in encoding.

Methods for syndrome calculation are known in the art. For example, U.S. Pat. No. 4,030,067, whose disclosure is incorporated herein by reference, describes an apparatus for directly decoding and correcting double-bit random errors per word and for detecting triple-bit errors per word. Said apparatus comprises a syndrome calculator which operates upon code words received from memory and generates syndromes. The syndromes are operated upon and translated by a mapping device which generates pointers identifying the bits which are in error.

In some applications, the GLDPC encoder or decoder needs to be implemented in hardware. Hardware and firmware implementations of a component decoder such as a BCH decoder are known in the art. For example, U.S. Pat. No. 8,381,082, whose disclosure is incorporated herein by reference, describes power-saving and area-efficient BCH coding systems that employ hybrid decoder architectures. The BCH decoder architectures comprise both special-purpose hardware and firmware. In particular, the error correction capabilities of the BCH decoders provided herein are split between a hardware component designed to correct a single error and a firmware component designed to correct the remaining errors.

SUMMARY

An embodiment that is described herein provides an apparatus that includes an interface, main and secondary processing modules, and circuitry. The interface is configured to receive input data to be processed in accordance with a GLDPC code defined by a parity-check-matrix including multiple sub-matrices, each sub-matrix including a main diagonal and one or more secondary diagonals, and each of the main and secondary diagonals includes N respective block matrices. The main processing module is configured to calculate N first partial syndromes based on the input data and on the block matrices of the main diagonals. The secondary processing module is configured to calculate N second partial syndromes based on the input data and on the block matrices of the secondary diagonals. The circuitry is configured to produce N syndromes by respectively combining the N first partial syndromes with the N second partial syndromes, and to encode or decode the input data, based on the N syndromes.

In some embodiments, the input data corresponds to a code word that was encoded using the GLDPC code, and the circuitry is configured to decode the code word using the N syndromes. In other embodiments, the parity-check-matrix includes a data-part matrix and a parity-part matrix, and the circuitry is configured to produce the N syndromes using the data-part matrix, and to encode the input data in accordance with the GLDPC code using the parity-part matrix and the N syndromes. In yet other embodiments, the block matrices are of a form $T^W H0$, H0 and T are matrices that depend on an underlying component code of the GLDPC code, T is diagonal, and W is an integer that is assigned a different value for each main diagonal and for each secondary diagonal of the sub-matrices.

In an embodiment, the main and secondary processing modules are configured to update a respective given partial syndrome by multiplying a respective bit-group of the input data Bi by a block matrix $T^W H0$ corresponding to a respective main or secondary diagonal to produce a product, and adding the product to the given partial syndrome. In another embodiment, the main and secondary processing modules are configured to update a respective given partial syndrome, recursively, by multiplying a respective bit-group of the input data Bi by H0 to produce a product, and adding the product to the given partial syndrome multiplied by matrix $T^2$. In yet other embodiment, the main and secondary processing modules include respective main and secondary memories that each stores a respective group of M partial syndromes per memory location, the main and secondary modules are configured to process M bit-groups of the input data, by updating in each of the main memory and the secondary memory respective M first partial syndromes and M secondary partial syndromes, in parallel, based on the M bit-groups.

In some embodiments, the M bit-groups are not aligned with respective M secondary partial syndromes retrieved together from a location of the secondary memory for update, and the secondary module is configured to buffer data of two M bit-groups of the input data, and to update the M secondary partial syndromes based on selected M bit-groups of the buffered data. In another embodiment, in processing a given sub-matrix, the secondary processing module is configured to defer updating of one or more secondary partial syndromes for which there is no aligned bit-group within the M bit-groups, until receiving last M bit-groups of the input data required for processing the given sub-matrix.

There is additionally provided, in accordance with an embodiment that is described herein, a method, including receiving input data to be encoded or decoded in accordance with a GLDPC code defined by a parity-check-matrix including one or more sub-matrices, each sub-matrix including a main diagonal and a secondary diagonal, and each of the main diagonal and the secondary diagonal includes N respective block matrices. Using a main processing module, N first partial syndromes are calculated based on the input data and on the block matrices of the main diagonals of the sub-matrices. Using a secondary processing module that operates in parallel with the main processing module, N second partial syndromes are further calculated based on the input data and on the block matrices of the secondary diagonals of the sub-matrices. N syndromes are produced by respectively combining the N first partial syndromes with the N second partial syndromes. The input data is encoded or decoded based on the N syndromes, in accordance with the GLDPC code.

These and other embodiments will be more fully understood from the following detailed description of the embodiments thereof, taken together with the drawings in which:

DETAILED DESCRIPTION OF EMBODIMENTS

Overview

Figure 1:
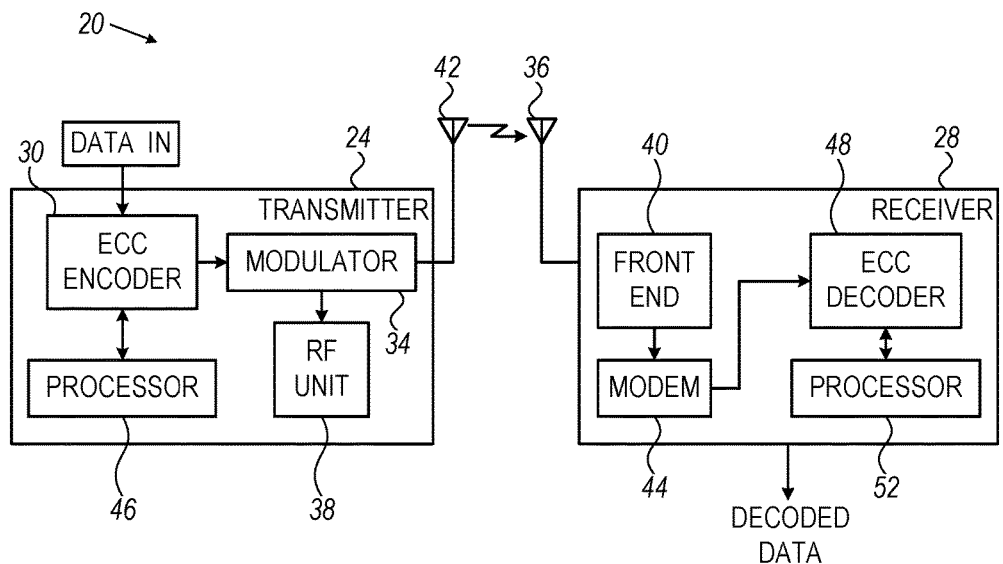
FIG. 1 is a block diagram that schematically illustrates a wireless communication system that uses error correction coding, in accordance with an embodiment that is described herein.

GLDPC codes typically comprise multiple sub-codes or component codes. GLDPC encoding produces GLDPC code words that comprise multiple component code words, each encoded using one of the underlying component codes, which may comprise any suitable linear codes, such as, for example, Hamming codes, Bose-Chaudhuri-Hocquenghem (BCH) codes, Reed-Solomon (RS) codes and Reed-Muller (RM) codes, or any suitable non-linear codes. A GLDPC code may comprise as few as thirty or less component codes, or as many as thousands or more component codes, for example.

GLDPC codes can typically be defined using a parity-check matrix comprising N block-rows corresponding to the N underlying component codes. Each of the block-rows comprises block matrices comprising the parity-check matrix of a respective component code.

A valid GLDPC code word may become corrupted for various reasons. For example, the code word may be sent over a non-ideal communication channel, or retrieved corrupted from a storage device such as a Flash memory. In the context of the present disclosure, the term "channel" refers to any operation that is applied to a valid code word and may corrupt it.

GLDPC decoding for recovering the valid code word can be carried out, for example, by first computing a set of syndromes, and then using the syndromes for locating erroneous bits in the code word. In cases in which the parity-check-matrix of the GLDPC code has a data part and a separate parity part, GLDPC encoding can be carried out by calculating a set of syndromes based on the input data and the data part matrix, and generating the parity bits of the code word based on the syndromes.

For some types of practical GLDPC codes, the number of component codes is very large, e.g., between 30 and several thousands, wherein each component code involves calculating a respective syndrome of several tens of bits, as part of decoding or encoding, and therefore this task is a very time and power consuming.

Embodiments that are described herein provide methods and systems for efficient syndrome calculation in processing GLDPC codes. In the disclosed embodiments, the GLDPC parity-check matrix comprises one or more sub-matrices, each comprising a main diagonal and one or more secondary diagonals. In a given sub-matrix, each of the main and secondary diagonals comprises N identical block matrices of the form $T^W H0$, wherein H0 and T are matrices that depend on the underlying component code, T is diagonal, and W is an integer assigned a different value for each of the main and secondary diagonals.

In the description that follows, we refer mainly to GLDPC codes in which the sub-matrices of the parity-check matrix comprise only a single secondary diagonal. The disclosed techniques can be adapted, however, to support sub-matrices comprising a main diagonal and multiple secondary diagonals.

In the disclosed embodiments, a syndrome calculator calculates N main partial syndromes and N secondary partial syndromes over the respective main and secondary diagonals of the sub-matrices. The syndrome calculator then combines the main and secondary partial syndromes to produce N syndromes corresponding to the N underlying component codes of the GLDPC code. The syndromes of the component codes are also referred to herein as "component syndromes."

In some embodiments, the syndrome calculator stores the main and secondary partial syndromes in separate respective main and secondary memories, wherein each memory location stores four partial syndromes. The syndrome calculator receives four eight-bit groups of input data, and updates four main partial syndromes and four secondary partial syndromes within a single clock cycle.

In some embodiments, the syndrome calculator updates a given partial syndrome by adding to it a product of eight input bits and a $T^W H0$ matrix corresponding to the relevant diagonal. In other embodiments, the syndrome calculator performs recursive update by multiplying the partial syndrome by the matrix T and adding a product of eight input bits and the matrix H0.

In some embodiments, the four eight-bit groups of the input data are not aligned with the four partial syndromes retrieved together from the memory. In such embodiments, the syndrome calculator buffers eight 8-bit groups of the input data, i.e., 64 bits overall, and selects therefrom four eight-bit groups that are aligned for updating the respective four partial syndromes. The syndrome calculator defers updating the partial syndromes for which the input data was not aligned, and buffers the respective input bits, until receiving the last four eight-bit groups of input data required for processing the current sub-matrix.

In the disclosed techniques, syndrome calculation is carried out by processing the input data in accordance with sub-matrices comprising the GLDPC parity-check matrix. The sub-matrices are processed efficiently by updating in parallel four main partial syndromes and four secondary partial syndromes, thus increasing throughput and reducing power consumption.

System Description

FIG. 1 is a block diagram that schematically illustrates a wireless communication system 20 that uses error correction coding, in accordance with an embodiment that is described herein. System 20 comprises a transmitter 24, which transmits data to a receiver 28. The transmitter accepts input data, encodes the data with a certain ECC encoder 30 (the encoded data is also referred to as a code word), modulates the encoded data, using a modulator 34, in accordance with a certain modulation scheme, converts the modulated digital signal to an analog signal, up-converts the analog signal to a suitable Radio frequency (RF) using an RF unit 38 and transmits the RF signal toward the receiver using a transmitting antenna 42. A processor 46 is configured to control the operation of ECC encoder 30. The structure and functionality of encoder 30 will be described in detail below.

In receiver 28, a receiving antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data (i.e., the received code word possibly containing one or more errors) is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems or optical communication systems, as well.

Figure 2:
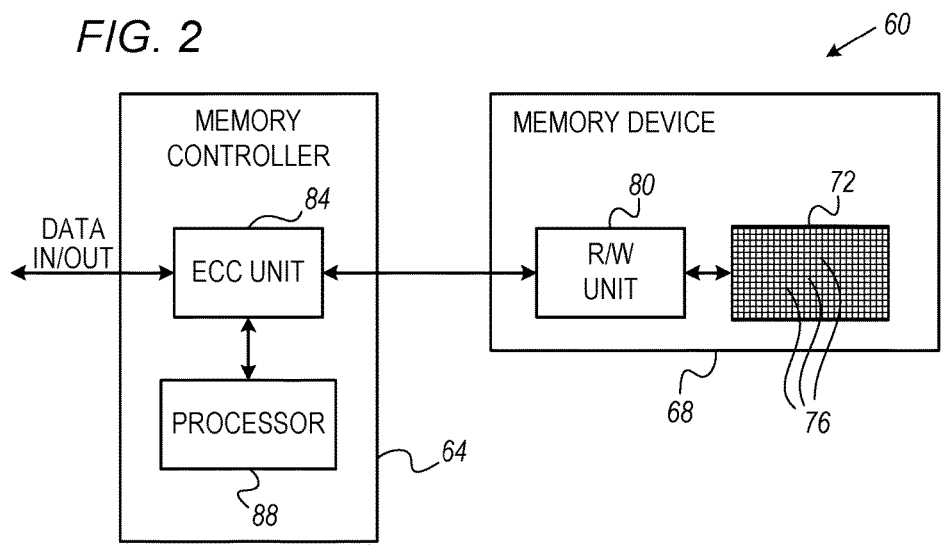
FIG. 2 is a block diagram that schematically illustrates a data storage system that uses error correction coding, in accordance with an alternative embodiment that is described herein.

FIG. 2 is a block diagram that schematically illustrates a data storage system 60 that uses error correction coding, in accordance with an alternative embodiment that is described herein. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules, Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage in accordance with a certain ECC, and decodes the ECC of data that is retrieved from the memory cells. Unit 84 is controlled by a processor 88. The structure and functionality of the encoding and decoding parts of unit 84 are described in detail below. The ECC used in systems 20 and 60 may comprise, for example, a Generalized Low-Density Parity-Check (GLDPC) code, as well as various other types of ECC.

The ECC encoding and decoding schemes described herein can be used in communication systems such as system 20, as well as in data storage systems such as system 60. The description that follows applies to both communication applications and to storage applications, and refers generally to a GLDPC ECC encoder or to a GLDPC ECC decoder. Any reference to the ECC encoder applies to encoder 30 of system 20, as well as to the encoder functionality of unit 84 in system 60. Similarly, any reference to the ECC decoder applies to decoder 48 of system 20, as well as to the decoder functionality of unit 84 in system 60. Alternatively, the methods described herein can be carried out by any other suitable element in any other suitable system that involves ECC encoding and/or decoding.

ECC Encoding and Decoding Based on Syndrome Calculation

Consider an ECC code, e.g., a GLDPC code, that can be represented by a respective parity-check matrix H that can be partitioned into a data part matrix denoted $H_s$ and a parity part matrix denoted $H_p$, i.e., $H=[H_s|H_p]$. Assuming that the code represented by H encodes k-bit data into n-bit code words, the parity-check matrix H has dimensions (n-k)-by-n, $H_s$ is (n-k)-by-k, and $H_p$ is (n-k)-by-(n-k).

Let d denote a k-bit vector of input data. The ECC encoder typically encodes the input data using the following steps:

Encoding step 1: calculate a syndrome s based on the input data and on $H_s$ given by:

$$s = H_s \cdot d \qquad \text{Equation 1:}$$

Encoding step 2: calculate the parity information p using the syndrome s and the inverse matrix of $H_p$.

$$p = -H_p^{-1} \cdot s \qquad \text{Equation 2:}$$

Encoding step 3: produce a code word CW by concatenating d and p.

$$CW = [d|p] \qquad \text{Equation 3:}$$

At the decoder side, the input r comprises a code word CW, which possibly contains one or more erroneous bits caused by the channel. The input can be written as:

$$r = CW + e \qquad \text{Equation 4:}$$

wherein e represents an error pattern.

The decoder may attempt to correct the erroneous bits given the input r using the following steps:

Decoding step 1: multiply r by the parity-check matrix H to produce a syndrome s:

$$s = H \cdot r \qquad \text{Equation 5:}$$

Decoding step 2: use the syndrome s to find the error pattern e. This step may be carried out using any suitable method known in the art such as, for example, the Peterson-Gorenstein-Zierler algorithm, Berlekamp-Massey algorithm or the Euclidean algorithm.

Decoding step 3: recover the non-erroneous code word CW by the adding the error pattern to r:

$$CW = r + e \qquad \text{Equation 6:}$$

GLDPC Codes with BCH Component Codes

The encoding and decoding schemes described above can be applied, for example, in encoding and decoding GLDPC codes. Although in the description that follows we refer mainly to GLDPC codes whose component codes comprise BCH component codes, in alternative embodiments, suitable component codes other than BCH, such as, for example, Reed Solomon (RS) codes can also be used.

Consider a BCH code, generated using a respective generator polynomial g(x) defined over some Galois Field (GF), and let α be a root of g(x), i.e., g(α)=0. The input r to the BCH decoder is regarded as a binary polynomial $R(x)=C(x)+E(x)$, wherein $C(x)$ and $E(x)$ are binary polynomials representing the code word and the error pattern, respectively.

Let $r=(b_1 \ldots b_n)$ denote the input bit-sequence, wherein $b_i$ denotes the $i^{th}$ input bit. In the disclosed embodiments, n is divisible by 8. The respective polynomial $R(x)$ is given by:

$$R(x)=b_1x+b_2x^2+\ldots+b_nx^n \quad \text{Equation 7:}$$

In the present example, the BCH component code is designed to correct up to three errors, and therefore the BCH decoder is required to evaluate $R(x)$ at $\alpha$, $\alpha^3$ and $\alpha^5$. The BCH parity-check matrix in this case is given by:

$$H_{BCH} = \begin{pmatrix} \alpha^0 & \alpha^1 & \alpha^2 & \alpha^3 & \ldots & \alpha^{(n-1)} \\ \alpha^0 & \alpha^3 & \alpha^6 & \alpha^9 & \ldots & \alpha^{3(n-1)} \\ \alpha^0 & \alpha^5 & \alpha^{10} & \alpha^{15} & \ldots & \alpha^{5(n-1)} \end{pmatrix} \quad \text{Equation 8}$$

$H_{BCH}$ can be represented as a concatenation of matrices of the form $$H_{BCH}=[H0|T\cdot H0|T^2\cdot H0|\ldots] \quad \text{Equation 9:}$$

wherein the matrices H0 and T are given by:

$$H0 = \begin{pmatrix} \alpha^0 & \alpha^1 & \alpha^2 & \alpha^3 & \ldots & \alpha^7 \\ \alpha^0 & \alpha^3 & \alpha^6 & \alpha^9 & \ldots & \alpha^{21} \\ \alpha^0 & \alpha^5 & \alpha^{10} & \alpha^{15} & \ldots & \alpha^{35} \end{pmatrix} \quad \text{Equation 10}$$

$$T = \begin{pmatrix} \alpha^8 & 0 & 0 \\ 0 & \alpha^{24} & 0 \\ 0 & 0 & \alpha^{40} \end{pmatrix} \quad \text{Equation 11}$$

In some embodiments, $\alpha$ and its powers, e.g., as in Equations 9-11, are represented as B-bit vectors, wherein B equals, for example, 10, 11 or 12 bits, depending on the underlying GF used, and the dimensions of H0 and T are determined accordingly.

Although the matrices H0 and T0 in Equations 10 and 11 correspond to a BCH code that corrects up to 3 errors, similar matrices can be constructed for BCH codes having other correction capabilities, as well as for other types of component codes such as cyclic codes.

GLDPC Codes Whose Parity-Check Matrix Comprises Block-Circulant Matrices

Figure 3:
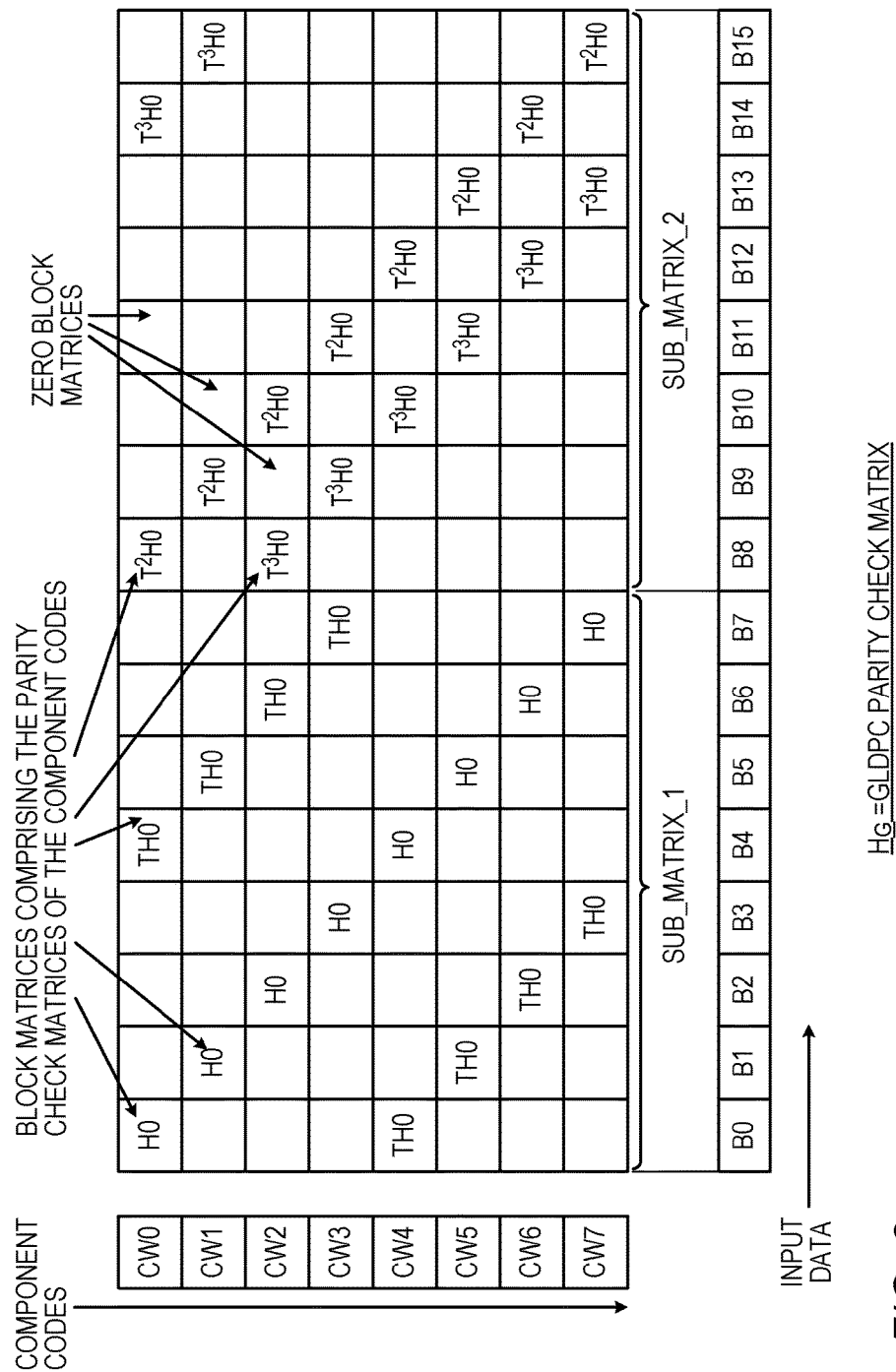
FIG. 3 is a diagram of a parity-check matrix of a Generalized Low-Density Parity-Check (GLDPC) code, in accordance with an embodiment that is described herein.

FIG. 3 is a diagram of a parity-check matrix $H_G$ of a Generalized Low-Density Parity-Check (GLDPC) code, in accordance with an embodiment that is described herein. The parity-check matrix in FIG. 3 comprises two sub-matrices denoted SUB_MATRIX_1 and SUB_MATRIX_2. Each of the sub-matrices is partitioned into N block-rows and N block-columns of block matrices, wherein in the present example N=8.

Each sub-matrix comprises a main diagonal and a secondary diagonal, each comprising N nonzero block matrices. The secondary diagonal wraps around the block-rows and block-columns. The block matrices outside the main and secondary diagonals comprise zero block matrices.

Although in the present example, each sub-matrix comprises a single secondary diagonal, in other embodiments, the sub-matrices may comprise multiple secondary diagonals. A matrix of this sort, which comprises N-by-N block matrices, including a main diagonal and one or more secondary diagonals of N nonzero block matrices each, and zero block matrices outside the main and secondary diagonals, is also referred to herein as a block-circulant matrix.

Parity-check matrix $H_G$ of FIG. 3 defines a GLDPC code having N=8 component codes. In the present example, the component codes comprise BCH codes whose parity-check matrix $H_{BCH}$ is given in Equation 9 above. In this example, each block-column in the GLDPC parity-check matrix corresponds to a group of eight input bits denoted Bi in the figure, wherein Bi is encoded by two BCH codes. For example, the input bits of group B0 are encoded to component code words CW0 and CW4, and the input bits of B1 are encoded to component code words CW1 and CW5. The number of code words sharing each bit (or a group of bits) is referred to as the variable node degree, denoted "dv". In the present example, dv=2.

The parity-check matrix of each of the component code words CW0 ... CW7 comprises multiple block matrices of the form $T^W H0$, wherein W is a nonnegative integer, as given by Equations 9-11 above. The block matrices $T^W H0$ are distributed along each block-row in accordance with the structure of SUB_MATRIX_1 and SUB_MATRIX_2.

Given the parity-check matrix $H_G$ and the groups of input data B0 ... B15, a syndrome can be calculated for each of the N=8 component codes. For example, the syndrome corresponding to CW0 is given by:

$$S(CW0)=H0\cdot B0+TH0\cdot B4+T^2H0\cdot B8+T^3H0\cdot B14 \quad \text{Equation 12:}$$

The expression in Equation 12 can be calculated in two separate sub-parts given by:

$$PS1(CW0)=(H0\cdot B0+T^2H0\cdot B8)$$

$$PS2(CW0)=(TH0\cdot B4+T^3H0\cdot B14) \quad \text{Equation 13:}$$

In Equation 13, PS1(CW0) and PS2(CW0) denote partial syndromes corresponding to block matrices belonging respectively to the main and secondary diagonals of SUB_MATRIX_1 and SUB_MATRIX_2. PS1(·) is also referred to herein as a "main partial syndrome" and PS2(·) is also referred to herein to as a "secondary partial syndrome." The syndrome S(CW0) is derived by combining the partial syndromes of the main and secondary diagonals as given by:

$$S(CW0)=PS1(CW0)+PS2(CW0) \quad \text{Equation 13:}$$

The syndromes corresponding to the other component codes S(CW1) ... S(CW7) can be derives in a similar manner by calculating separate partial syndromes PS1(CWi) and PS2(CWi) over the main and secondary diagonals of the sub-matrices, and respectively combining the resulting partial syndromes to derive the component code syndrome, i.e., S(CWi)=PS1(CWi)+PS2(CWi).

The GLDPC parity-check matrix depicted in FIG. 3 is given by way of example, and in alternative embodiments, other suitable parity-check matrices can also be used. For example, the GLDPC parity check-matrix may correspond to a GLDPC code having a number of component codes other than N=8 and the number of sub-matrices (such as SUB_MATRIX_1 and SUB_MATRIX_2 in FIG. 3) may be different than two. In addition, a similar GLDPC code may be constructed by permuting the order of the sub-matrices.

Efficient Syndrome Calculation

Figure 4:
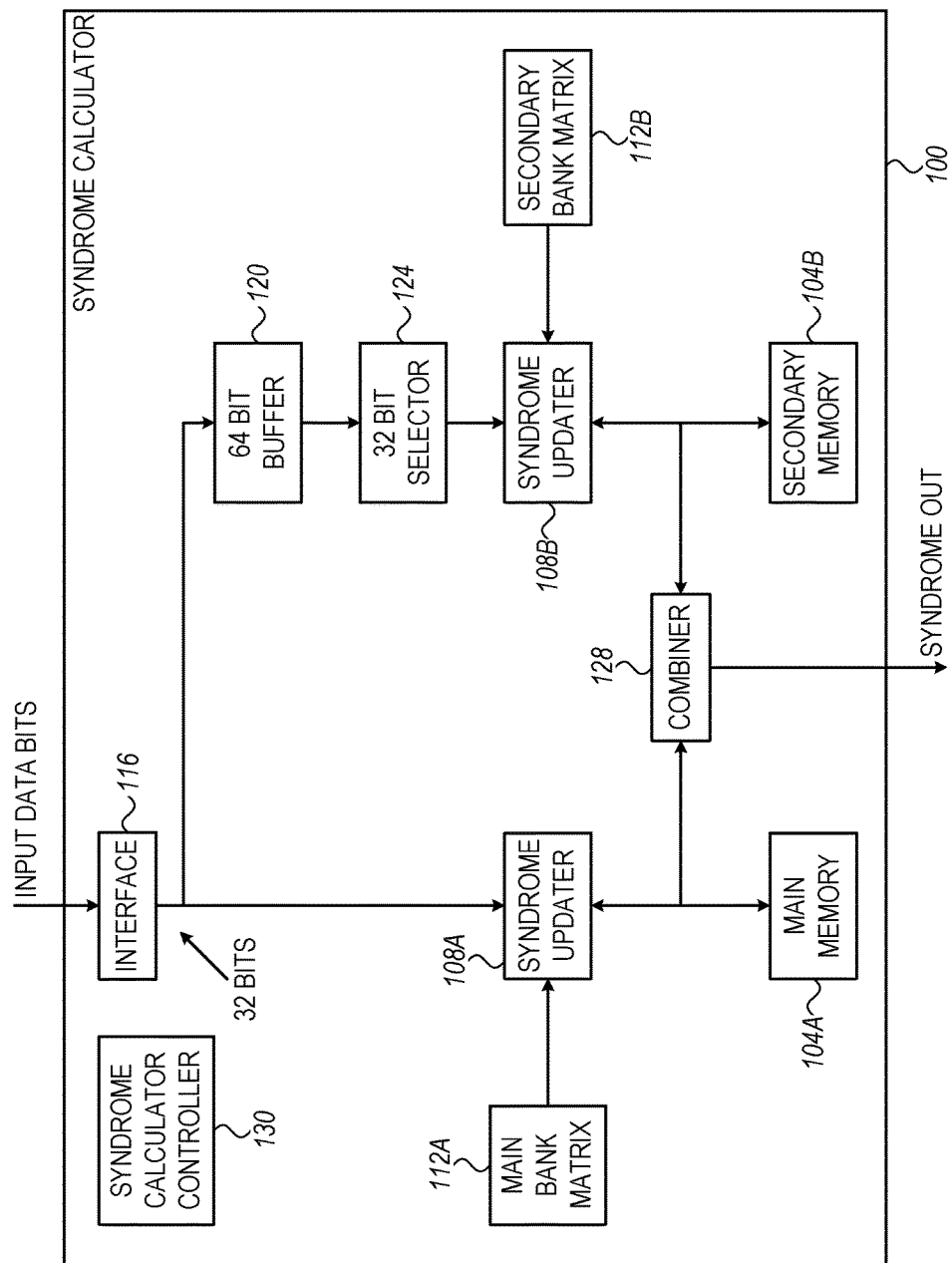
FIG. 4 is a block diagram that schematically illustrates a syndrome calculator, in accordance with an embodiment that is described herein.

FIG. 4 is a block diagram that schematically illustrates a syndrome calculator 100, in accordance with an embodiment that is described herein. Syndrome calculator 100 can be used for GLDPC encoding, for example, in ECC encoder 30, and/or in implementing the encoder part of ECC module 84. Alternatively or additionally, syndrome calculator 100 can be used for GLDPC decoding in ECC decoder 48, and/or in implementing the decoder part of ECC module 84.

Syndrome calculator 100 is designed to calculate N syndromes corresponding to N respective component codes of a GLDPC code. In the description that follows, syndrome calculator 100 is described with respect to a GLDPC code comprising N=8 component codes, whose parity-check matrix $H_G$ is described in FIG. 3 above.

As will be described in detail below, syndrome calculator 100 calculates, for the N component codes, N respective main partial syndromes and N respective secondary partial syndromes, and respectively combines the N partial main syndromes with the N secondary partial syndromes to produce the N syndromes.

Syndrome calculator 100 comprises a main memory 104A and a secondary memory 104B for storing main and secondary partial syndromes, respectively. In calculating a complete set of N syndromes, each of memories 104A and 104B stores N partial syndromes (main or diagonal) corresponding to the respective N component codes.

In some embodiments, memories 104A and 104B support accessing each partial syndrome individually. In such embodiments, accessing the partial syndromes is flexible but slow, because typically only one memory location can be accessed within a clock cycle. In other embodiments, memories 104A and 104B support accessing multiple (e.g., four) partial syndromes in parallel. In these embodiments, accessing the partial syndromes is fast, but as will be explained below, the implementation processes partial syndromes that may be stored in different memory locations, and needs to buffer larger amounts of input data and delay the processing.

In the context of the present disclosure, operations carried out within one clock cycle are considered as being executed "simultaneously" or "in parallel."

Syndrome calculator 100 comprises syndrome updaters 108A and 108B for cumulatively calculating the main and secondary partial syndromes, respectively. Syndrome updater 108A retrieves one or more main partial syndromes from main memory 104A, updates the retrieved partial syndromes based on relevant input data, and stores the updated main partial syndromes back in memory 104A. Syndrome updater 108B similarly updates secondary partial syndromes in secondary memory 104B. This split architecture enables the syndrome calculator to update eight partial syndromes within a single clock cycle.

In some embodiments, in a single update operation, syndrome updater 108A or 108B multiplies a block matrix of the form $T^W H0$ by an eight-bit group Bi of the input data, and adds the resulting product to the partial syndrome retrieved from memory 104A or 104B, respectively. When accessing multiple partial syndromes in a given memory location, the syndrome updater updates these multiple partial syndromes, simultaneously, in the given memory location.

Syndrome calculator 100 comprises main and secondary matrix banks 112A and 112B for storing the block matrices of the main and secondary diagonals of the sub-matrices. In the present example, matrix bank 112A stores matrices of the form $T^W H0$ in which W is odd, and matrix bank 112B stores matrices of the form $T^W H0$ in which W is even.

As described above, syndrome updaters 108A and 108B operate in parallel to update together eight partial syndromes within a single clock cycle. Since updating a single partial syndrome requires an eight-bit input, the updating of four partial syndromes in parallel requires four respective eight-bit input groups, i.e., 32 bits of the input data.

Syndrome calculator 100 comprises an interface 116 that fetches input data in groups of 32 bits. For example, with reference to FIG. 2, interface 116 fetches each batch B0 . . . B3, B4 . . . B7, B8 . . . B11 or B12 . . . B15 in a single clock cycle. Each 32-bit group of the input data is aligned with respective four main partial syndromes stored in the same location of memory 104A. This enables the syndrome calculator to fetch 32 input bits and update four main partial syndromes from memory 104A within one clock cycle.

Unlike the main partial syndromes, in processing the secondary partial syndromes, a 32-bit group of the input data may be aligned to four secondary partial syndromes that are stored in more than one consecutive locations of memory 104B. Syndrome calculator 100 comprises a 64-bit buffer 120 that can accept 32 bits of input data from interface 116 in a single clock cycle. Buffer 120 can store up to two groups of 32 bits. A selector 124 selects in each clock cycle four eight-bit groups from buffer 120 for updating four respective secondary partial syndromes by syndrome updater 108B.

In some embodiments, syndrome calculator 100 calculates the main and secondary partial syndromes by processing the matrix $H_G$ in a left-to-right order, thus updating the main and secondary partial syndromes based on SUB_MATRIX_1 and then based on SUB_MATRIX_2. In each clock cycle, interface 116 fetches 32 input bits that are used for updating four main partial syndromes and four secondary partial syndromes.

For example, inputs B0 . . . B3 are used in updating the main partial syndromes of CW0 . . . CW3 using H0 from matrix bank 112A, as well as for updating the secondary partial syndromes of CW4 . . . CW7 using TH0 from matrix bank 112B. In the following clock cycle, interface 116 fetches B4 . . . B7, which are used for updating the main partial syndromes of CW4 . . . CW7 using H0 from matrix bank 112A, and for updating the secondary partial syndromes of CW0 . . . CW3 using TH0 from matrix bank 112B.

Updating the main partial syndromes based on the main diagonal of SUB_MATRIX_2 is carried out in a similar manner, i.e., input bits B8 . . . B11 are used in updating the main partial syndromes of CW0 . . . CW3, and B12 . . . B15 are used in updating the main partial syndromes of CW4 . . . CW7, both using $T^2 H0$ from matrix bank 112A.

Updating the secondary partial syndromes based on the secondary diagonal of SUB_MATRIX_2 is more complex because of possible misalignment between the input bits and the storage of the secondary partial syndromes in memory 104B. The main partial syndromes of CW0 . . . CW3 are stored in one location of memory 104A, and the secondary partial syndromes of CW0 . . . CW3 are stored in one location of memory 104B. Similarly, the main and secondary partial syndromes of CW4 . . . CW7 are stored in one location in each memory 104A or 104B, respectively.

As seen in FIG. 3, the 32 input bits B8 . . . B11, should be used for updating the main and partial syndromes of CW2 . . . CW5, which are not all stored in the same memory location. Therefore, the syndrome calculator fetches B12 . . . B15 in a subsequent clock cycle so that buffer 120 contains 64 input bits—B8 . . . B15. Then, selector 124 selects B10 . . . B13 from the buffer, for updating the partial syndromes CW4 . . . CW7 in memory 104B. In the next clock cycle, selector 124 selects 32 bits (B8, B9, B14, B15)

from buffer 120, and syndrome updater 108B uses these bits for updating the secondary partial syndromes of CW0, CW1, CW2, CW3.

After processing the entire matrix $H_G$, memory 104A holds N=8 main partial syndromes PS1(0) . . . PS1(7), and memory 104B holds N=8 secondary partial syndromes PS2(0) . . . PS2(7). A combiner 128 combines the respective main and secondary partial syndromes to produce N=8 syndromes, i.e., S(i)=PS1(i)+PS2(i), i=0 . . . 7. In the embodiment of FIG. 4, syndrome calculator 100 combines the main and secondary partial syndromes for outputting the component syndromes S(0) . . . S(7) when the partial syndromes are ready. In alternative embodiments, the syndrome calculator saves the combined syndromes S(0) . . . S(7), e.g., in memory 104A or 104B, or in some other memory (not shown) for later use. Further alternatively, the syndrome calculator combines the partial syndromes using combiner 128 upon request.

Syndrome calculator 100 comprises a controller 130 that schedules the operations of the different syndrome calculator elements. For example, the controller handles fetching input bits and coordinates the updating of the partial syndromes in memories 104A and 104B, as appropriate.

Syndrome calculator 100 may be implemented in hardware in various configurations. For example, in some embodiments, memories 104A and 104B, as well as matrix banks 112A and 112B are all implemented as separate storage areas within a single memory device, which syndrome updaters 108A and 108B access via a suitable bus. In other embodiments, one or more of memories 104A and 104B, and matrix banks 112A and 112B is implemented as a separate storage component that connects to a respective syndrome updater 108A or 108B via a suitable interconnection or bus.

Figure 5:
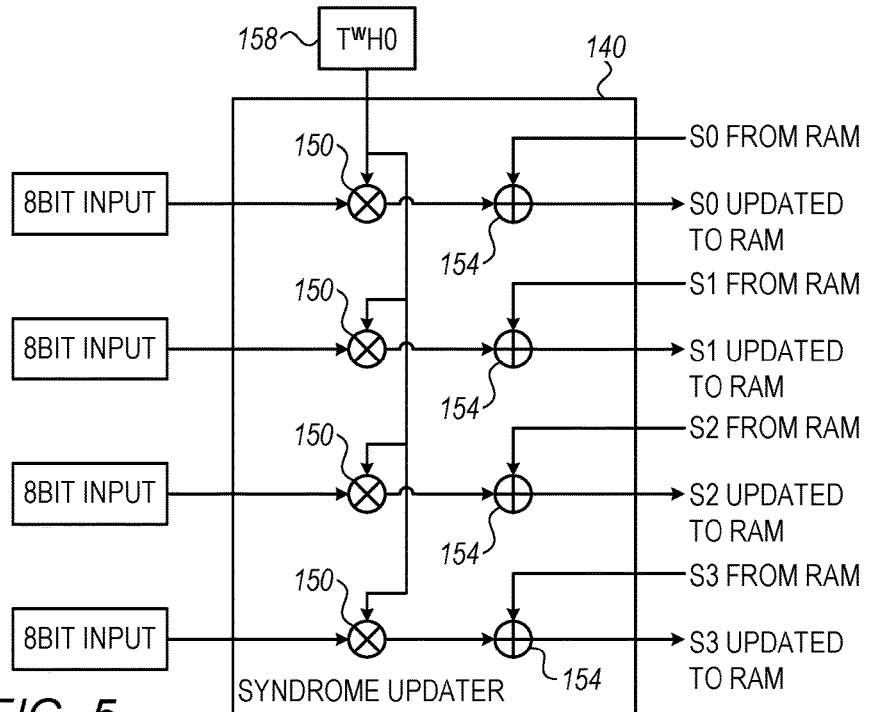
FIGS. 5 and 6 are block diagrams that schematically illustrate syndrome updaters, in accordance with embodiments that are described herein.
Figure 6:
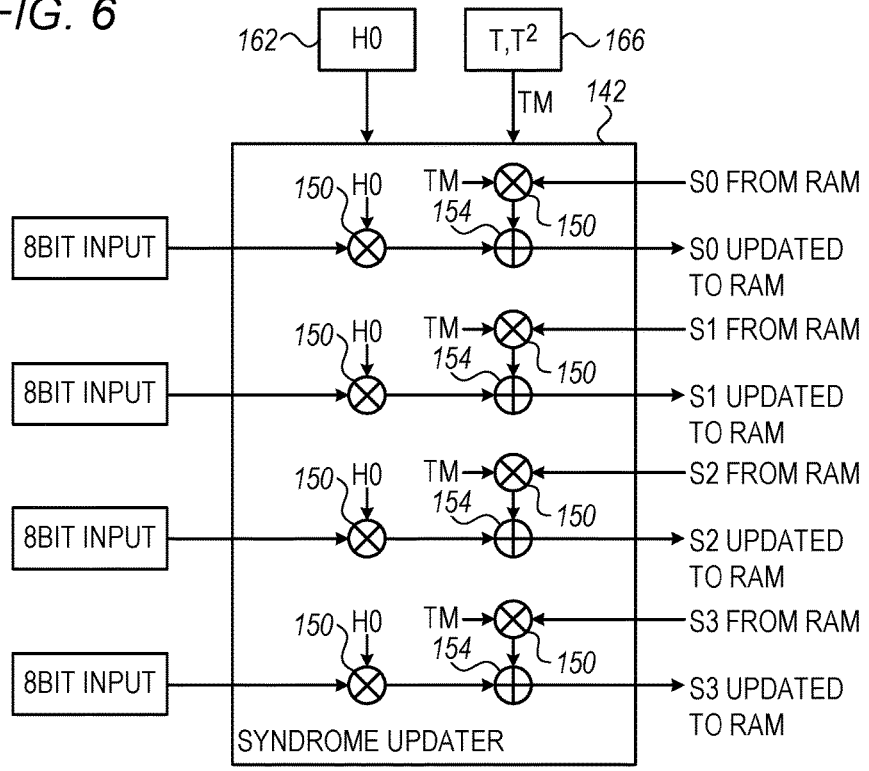

FIGS. 5 and 6 are block diagrams that schematically illustrate syndrome updaters 140 and 142, in accordance with embodiments that are described herein. The syndrome updaters in FIGS. 5 and 6 can be used in implementing syndrome updaters 108A and 108B of FIG. 4 above.

Syndrome updater 140 of FIG. 5 comprises four updating modules, each comprising a multiplier 150 and an adder 154. Multiplier 150 accepts an eight-bit group Bi of input data, and a matrix of the form $T^W H0$ 158. For even W, matrix 158 is stored in matrix bank 112A, and for odd W matrix 158 is stored in matrix bank 112B. Syndrome calculator 100 selects matrix 158 depending on the diagonals of the sub-matrix of $H_G$ being processed.

The output of multiplier 150, i.e., $T^W H0 \cdot Bi$, inputs adder 154, which additionally receives a main or secondary partial syndrome from memory 104A or 104B, respectively. The syndrome updater updates the partial syndrome by calculating $PS=PS+T H0 \cdot Bi$, and the syndrome calculator stores the updated partial syndrome back in the relevant memory. In an embodiment, the updating in memory is carried out in-place, i.e., the updated syndrome replaces its content in the same memory location. Alternatively, the updated syndrome is stored in a different memory location than the pre-updated partial syndrome.

In the present example, syndrome updater 140 comprises four updating modules. Multiplier 150 in each module multiplies the same matrix $T^W H0$ by a respective eight-bit group of input data, in parallel. This configuration supports updating four partial syndromes within a single clock cycle.

Syndrome updater 142 of FIG. 6 comprises four updating modules, each comprising two multipliers 150 and an adder 154. Syndrome updater 142 receives matrix H0 162 and a matrix TM (i.e., $T^2$ or T) 166 and uses these matrices for updating the partial syndromes. In this embodiment, updater 142 updates the partial syndromes recursively, as described herein.

Let j denote the index of the recursive iteration. When used for updating the main partial syndrome, PS1 is initialized to $PS1=H0 \cdot B0$ and the recursive step is given by $PS1(j+1)=T^2 \cdot PS1(j)+H0 \cdot Bi$. Similarly, when used for updating the secondary partial syndrome, PS2 is initialized to $PS2=T \cdot H0 \cdot B0$, and updated recursively by calculating $PS2(j+1)=T^2 \cdot PS2(j)+T \cdot H0 \cdot Bi$. Note that with respect to the parity-check matrix $H_G$ of FIG. 2, the recursive calculation is carried out by scanning the inputs Bi from B15 down to B0. In an alternative embodiment, $H_G$ is defined with the order of the sub-matrices reversed, i.e., the higher powers of T for SUB_MATRIX_1 and the lower powers of T for SUB_MATRIX_2.

In the present example, syndrome updater 142 comprises four updating modules as described above, which update four partial syndromes in parallel. Updater 142 requires less storage space than updater 140 because the recursive calculations require to store only H0, T and $T^2$, compared to $T^W H0$ for various values of W in using updater 140.

Updaters 140 and 142 may be implemented in hardware, in which case multiplier 150 and adder 154 comprise hardware components configured respectively to perform multiplication and addition in the underlying GF of the GLDPC code.

Figure 7:
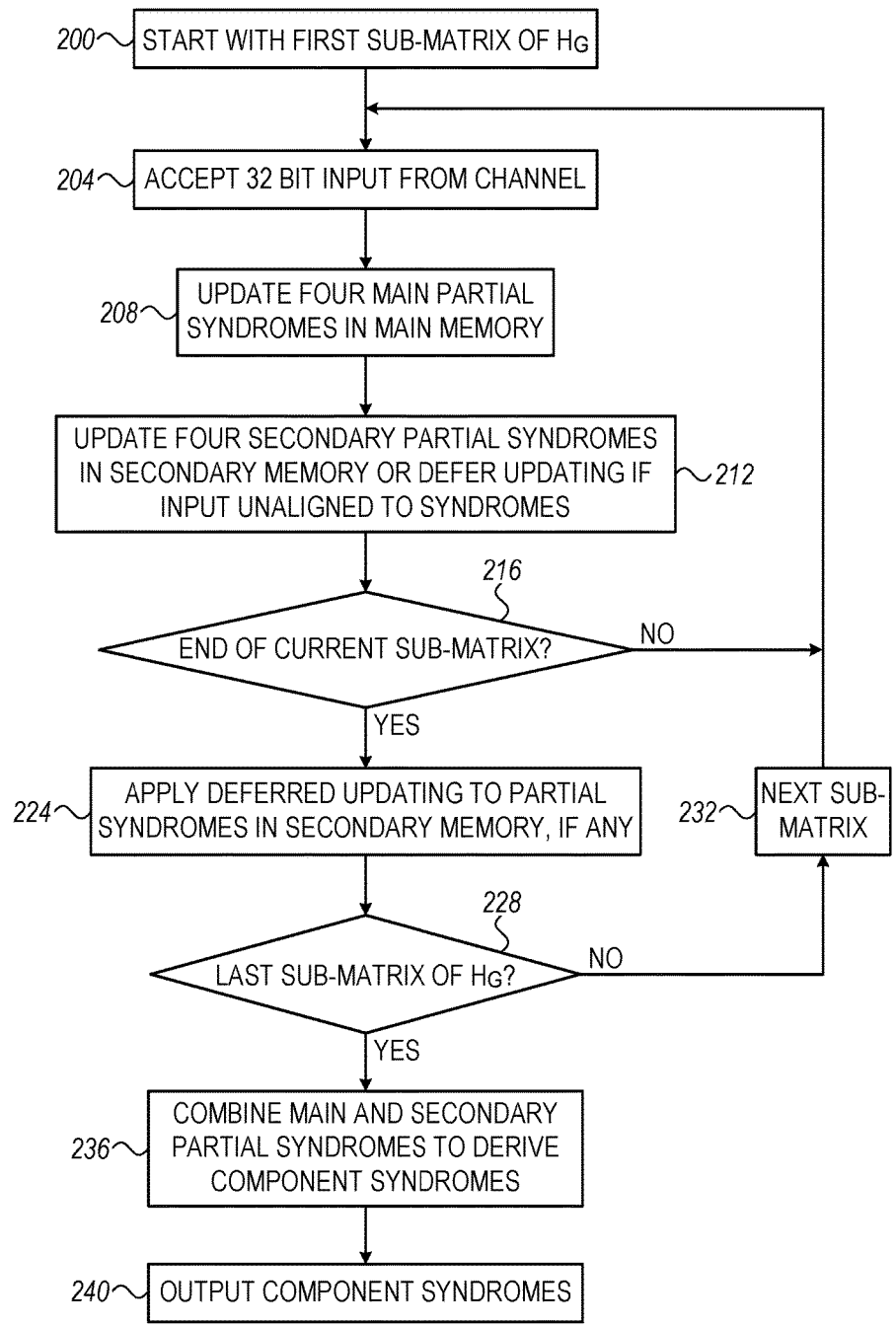
FIG. 7 is a flow chart that schematically illustrates a method for calculating component code syndromes of a GLDPC code, in accordance with an embodiment that is described herein.

FIG. 7 is a flow chart that schematically illustrates a method for calculating component code syndromes of a GLDPC code, in accordance with an embodiment that is described herein. The method is described as executed by syndrome calculator 100 of FIG. 4, and with reference to the GLDPC code as defined by parity-check matrix $H_G$ of FIG. 3.

At an initialization step 200, syndrome calculator 100 initializes the syndrome calculation to start with SUB_MATRIX_1 of parity-check matrix $H_G$. In addition, the syndrome calculator clears N=8 main partial syndromes in memory 104A and N=8 secondary partial syndromes in memory 104B. At a reception step 204, the syndrome calculator receives 32 input bits, i.e., B0 . . . B3, from the channel via interface 116. At later applications of step 204, subsequent 32-bit groups of input data are input, i.e., B4 . . . B7, B8 . . . B11 and B12 . . . B15.

At a main diagonal processing step 208, syndrome calculator 100 uses B0 . . . B3 to update, in memory 104A, four main partial syndromes corresponding to component code words CW0 . . . CW3. At a secondary diagonal processing step 212, the syndrome calculator uses B0 . . . B3 to update, in memory 104B, four secondary partial syndromes corresponding to component code words CW4 . . . CW7. In some embodiments, the updating operation is implemented using syndrome updater 140 or 142 described respectively in FIGS. 5 and 6 above.

In some embodiments, the four secondary partial syndromes that are read together from the same location in memory 104B are not aligned with the respective 32 input bits as defined by the structure of $H_G$. For example, when processing SUB_MATRIX_2, the syndrome calculator inputs 32 bits B8 . . . B11 at step 204, and reads the four secondary partial syndromes of CW0 . . . CW3 from memory 104B at step 212. In this case, since B8 . . . B11 are not aligned with CW2 . . . CW5, updating CW0 and CW1 is deferred until the processing of SUB_MATRIX_2 is concluded.

In some embodiments, the syndrome calculator applies an additional clock cycle for inputting subsequent 32 bits B12 ... B15 to buffer 120. Then, selector 124 selects from among the 64 bits B8 ... B15 in the buffer the four bit-groups B10 ... B13 for updating the secondary partial syndromes of CW2 ... CW5. The updating of CW0 and CW1 in this case is deferred.

At a sub-matrix termination step 216, the syndrome calculator checks whether the entire sub-matrix has been processed, and if not, loops back to step 204 to receive subsequent 32 input bits, i.e., B4 ... B7 for SUB_MATRIX_1 or B11 ... B15 for SUB_MATRIX_2. Otherwise, the current sub-matrix has been processed and the method proceeds to a deferred updating step 224, in which the syndrome calculator carries out operations that were deferred at step 212. For example, regarding SUB_MATRIX_2, the secondary partial syndromes of CW0 and CW1 that were deferred at step 212, are updated at step 224 using inputs B8 and B9, along with the secondary partial syndromes of CW2 and CW3 that are updated using inputs B14 and B15.

At a parity-check matrix termination step 228, the syndrome calculator checks whether all the sub-matrices of $H_G$ have been processed, and if not, selects the next sub-matrix at a sub-matrix selection step 232, and loops back to step 204. Otherwise, the entire parity-check matrix $H_G$ has been processed, which means that at this point N=8 fully updated main partial syndromes PS1(0) ... PS1(7) are stored in memory 104A and N=8 fully updated secondary partial syndromes PS2(0) ... PS2(7) are stored in memory 104B.

In this case at a combination step 236, the syndrome calculator combines for each component code word CWi its respective partial syndromes PS1(i)+PS2(i) to derive the respective syndrome S(i). At an output step 240, the syndrome calculator outputs the N=8 syndromes of the component codes, and the method then terminates.

The encoding and decoding configurations described above in FIGS. 1, 2 and 4-6 are given by way of example, and other suitable configurations can also be used. Specifically, each of ECC encoder 30 and ECC decoder 48 of FIG. 1, ECC unit 84 of FIG. 2, syndrome calculator 100 of FIG. 4, and syndrome updaters 140 of FIGS. 5 and 142 of FIG. 6 may be implemented in software, in hardware, or using a combination of hardware and software elements.

Elements of ECC encoder 30, ECC decoder 48 and ECC unit 84 outside syndrome calculator 100, as well as combiner 128 of syndrome calculator 100, are collectively referred to in the claims as "circuitry."

In some embodiments, ECC encoder 30, ECC decoder 48, unit 84 and/or parts thereof such as syndrome calculator 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, ECC encoder 30, ECC decoder 48 unit 84, syndrome calculator 100 and/or syndrome updaters 140 and 142 are implemented in hardware, such as using one or more Application-Specific Integrated Circuits (ASICs), Field-Programmable gate Arrays (FPGAs) and/or discrete components.

The embodiments described above were given by way of example, and other suitable embodiments can also be used. For example, the described above embodiments are applicable to GLDPC codes having a parity-check matrix other than $H_G$ of FIG. 3. For example, the number of component codes (or sub-matrices per columns) may be different than N=8, and the number of sub-matrices (such as SUB_MATRIX_1 and SUB_MATRIX_2 in the figure) may be other than two. In addition, syndrome calculator 100 can be designed to store in a single memory location, and to update in parallel, a number of partial syndromes other than four.

In some embodiments, the sub-matrices of the parity-check matrix have multiple secondary diagonals, i.e., dv>2. In such embodiments, the syndrome calculator comprises multiple secondary memories such as 104B and multiple syndrome updaters such as 108B so that the syndrome calculator updates within one clock cycle four main partial syndromes and 4·(dv−1) secondary partial syndromes.

In the example embodiments described above, N=8 is divisible by four, which is the number of partial syndromes updated in parallel. This, however is not a mandatory requirement. Consider, for example, a GLDPC code having N=6 component codes and a syndrome calculator that processes four partial syndromes in parallel. In such embodiments, only 16 bits of the 32 input bits are needed for updating the last four partial syndromes i.e., two main and two secondary, in processing each sub-matrix, and therefore the syndrome calculator carries the 16 unused input bits for processing the next sub-matrix.

Deferring the updating of some partial syndromes is now demonstrated for a GLDPC codes comprising N=20 component codes. In Table 1 below, secondary partial are stored in memory, so that each memory location stores four partial syndromes.

TABLE 1

| secondary partial syndromes in memory | | | | |
|---|---|---|---|---|
| Location1 | PS2(CW0) | PS2(CW1) | PS2(CW2) | PS2(CW3) |
| Location2 | PS2(CW4) | PS2(CW5) | PS2(CW6) | PS2(CW7) |
| Location3 | PS2(CW8) | PS2(CW9) | PS2(CW10) | PS2(CW11) |
| Location4 | PS2(CW12) | PS2(CW13) | PS2(CW14) | PS2(CW15) |
| Location4 | PS2(CW16) | PS2(CW17) | PS2(CW18) | PS2(CW19) |

Consider a sub-matrix in which the secondary diagonal starts at PS2(CW8). In this case the input bits are aligned with the partial syndromes, and within one clock cycle, the syndrome calculator can read, modify and write back to the memory four secondary partial syndromes.

If, however, the secondary diagonal starts at PS2(CW5), the first 32 bits should be used for updating PS2 (CW5), PS2 (CW6), PS2 (CW7) and PS2(CW8). As seen in Table 1, these partial syndromes are not all stored in one memory location. Therefore, the syndrome calculator buffers the first 32 bits and at the second clock cycle buffers additional 32 bits, i.e., overall 64 bits are buffered. The syndrome calculator is then able to update PS2(CW8) ... PS2(CW11), and defers the updating of PS2(CW5), PS2(CW6), PS2(CW7). By the next clock cycle, the syndrome calculator replaces the lastly buffered 32 bits, and updates PS2(CW12) ... PS2(CW15). Note that the input bits required for updating PS2(CW5), PS2(CW6) and PS2(CW7) remain buffered. When processing the sub-matrix ends, the syndrome calculator applies an extra clock cycle for updating [PS2 (CW5), PS2 (CW6), PS2 (CW7), PS2(CW4)].

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
an interface, which is configured to receive input data to be processed in accordance with a Generalized Low-Density Parity-Check (GLDPC) code defined by a parity-check-matrix comprising multiple sub-matrices, wherein each of the sub-matrices comprises N block-rows and N block-columns of block matrices, wherein the sub-matrices comprise main diagonals and secondary diagonals, and wherein each of the main diagonals and each of the secondary diagonals comprises N respective block matrices;
a main processing module, which is configured to calculate N first partial syndromes based on the input data and on the block matrices of the main diagonals of the sub-matrices;
a secondary processing module, which is configured to calculate N second partial syndromes based on the input data and on the block matrices of the secondary diagonals of the sub-matrices; and
combiner circuitry, which is configured to produce N syndromes by respectively combining the N first partial syndromes with the N second partial syndromes, and to encode or decode the input data, based on the N syndromes, in accordance with the GLDPC code.

2. The apparatus according to claim 1, wherein the input data corresponds to a code word that was encoded using the GLDPC code, and wherein the combiner circuitry is configured to decode the code word using the N syndromes.

3. The apparatus according to claim 1, wherein the parity-check-matrix comprises a data-part matrix and a parity-part matrix, and wherein the combiner circuitry is configured to produce the N syndromes using the data-part matrix, and to encode the input data in accordance with the GLDPC code using the parity-part matrix and the N syndromes.

4. The apparatus according to claim 1, wherein the block matrices are of a form $T^W H0$, wherein H0 and T are matrices that depend on an underlying component code of the GLDPC code, wherein the matrix T is a diagonal matrix, and wherein W is an integer that is assigned a different value for each main diagonal and for each secondary diagonal of the sub-matrices.

5. The apparatus according to claim 4, wherein the main and secondary processing modules are configured to update a respective given partial syndrome by multiplying a respective bit-group of the input data Bi by a block matrix $T^W H0$ corresponding to a respective main or secondary diagonal to produce a product, and adding the product to the given partial syndrome.

6. The apparatus according to claim 4, wherein the main and secondary processing modules are configured to update a respective given partial syndrome, recursively, by multiplying a respective bit-group of the input data Bi by H0 to produce a product, and adding the product to the given partial syndrome multiplied by matrix $T^2$.

7. The apparatus according to claim 1, wherein the interface is configured to receive the input data for processing in units of M bit-groups, wherein the main and secondary processing modules comprise respective main and secondary memories that each stores a respective group of M partial syndromes per memory location, wherein the main and secondary modules are configured to process M bit-groups of the input data, by updating in each of the main memory and the secondary memory respective M first partial syndromes and M secondary partial syndromes, in parallel, based on the M bit-groups.

8. The apparatus according to claim 7, wherein the M bit-groups are not aligned with respective M secondary partial syndromes retrieved together from a location of the secondary memory for update, and wherein the secondary module is configured to buffer data of two M bit-groups of the input data, and to update the M secondary partial syndromes based on selected M bit-groups of the buffered data.

9. The apparatus according to claim 8, wherein in processing a given sub-matrix, the secondary processing module is configured to defer updating of one or more secondary partial syndromes for which there is no aligned bit-group within the M bit-groups, until receiving last M bit-groups of the input data required for processing the given sub-matrix.

10. The apparatus according to claim 1, wherein the input data is stored in a memory device, and wherein the interface is configured to receive the input data from the memory device.

11. The apparatus according to claim 1, wherein the input data is received in a communication signal, and wherein the interface is configured to receive the input data received in the communication signal.

12. A method, comprising:
receiving, by a syndrome calculator, input data to be encoded or decoded in accordance with a Generalized Low-Density Parity-Check (GLDPC) code defined by a parity-check-matrix comprising multiple sub-matrices, wherein each of the sub-matrices comprises N block-rows and N block-columns of block matrices, wherein the sub-matrices comprise main diagonals and secondary diagonals, and wherein each of the main diagonals and each of the secondary diagonals comprises N respective block matrices;
calculating, using a main processing module, N first partial syndromes based on the input data and on the block matrices of the main diagonals of the sub-matrices;
further calculating, using a secondary processing module that operates in parallel with the main processing module, N second partial syndromes based on the input data and on the block matrices of the secondary diagonals of the sub-matrices;
producing N syndromes by respectively combining the N first partial syndromes with the N second partial syndromes, by the syndrome calculator; and
encoding or decoding the input data, based on the N syndromes, in accordance with the GLDPC code.

13. The method according to claim 12, wherein the input data corresponds to a code word that was encoded using the GLDPC code, and wherein decoding the input data comprises decoding the code word using the N syndromes.

14. The method according to claim 12, wherein the parity-check-matrix comprises a data-part matrix and a parity-part matrix, and wherein encoding the input data comprises producing the N syndromes using the data-part matrix, and encoding the input data in accordance with the GLDPC code using the parity-part matrix and the N syndromes.

15. The method according to claim 12, wherein the block matrices are of a form $T^W H0$, wherein H0 and T are matrices that depend on an underlying component code of the GLDPC code, wherein the matrix T is a diagonal matrix, and wherein W is an integer that is assigned a different value for each main diagonal and for each secondary diagonal of the sub-matrices.

16. The method according to claim 15, and comprising updating a respective given partial syndrome by multiplying a respective bit-group of the input data Bi by a block matrix $T^W H0$ corresponding to a respective main or secondary diagonal to produce a product, and adding the product to the given partial syndrome.

17. The method according to claim 15, and comprising updating a respective given partial syndrome, recursively, by multiplying a respective bit-group of the input data Bi by H0 to produce a product, and adding the product to the given partial syndrome multiplied by matrix $T^2$.

18. The method according to claim 12, wherein receiving the input data comprises receiving the input data for processing in units of M bit-groups, wherein the main and secondary processing modules comprise respective main and secondary memories that each stores a respective group of M partial syndromes per memory location, and comprising processing M bit-groups of the input data, by updating in each of the main memory and the secondary memory respective M first partial syndromes and M secondary partial syndromes, in parallel, based on the M bit-groups.

19. The method according to claim 18, wherein the M bit-groups are not aligned with respective M secondary partial syndromes retrieved together from a location of the secondary memory for update, and comprising buffering data of two M bit-groups of the input data, and updating the M secondary partial syndromes based on selected M bit-groups of the buffered data.

20. The method according to claim 19, wherein updating the M secondary partial syndromes in given sub-matrix comprise deferring the updating of one or more secondary partial syndromes for which there is no aligned bit-group within the M bit-groups, until receiving last M bit-groups of the input data required for processing the given sub-matrix.

* * * * *